US011960421B2

United States Patent
Liu et al.

(10) Patent No.: US 11,960,421 B2
(45) Date of Patent: Apr. 16, 2024

(54) OPERATION ACCELERATOR AND COMPRESSION METHOD

(71) Applicant: HUAWEI TECHNOLOGIES CO., LTD., Guangdong (CN)

(72) Inventors: Baoqing Liu, Hangzhou (CN); Hu Liu, Shenzhen (CN); Qinglong Chen, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 475 days.

(21) Appl. No.: 17/216,476

(22) Filed: Mar. 29, 2021

(65) Prior Publication Data

US 2021/0216483 A1 Jul. 15, 2021

Related U.S. Application Data

(63) Continuation of application No. PCT/CN2018/109117, filed on Sep. 30, 2018.

(51) Int. Cl.
*G06F 13/28* (2006.01)
*G06F 17/16* (2006.01)
*H03M 7/30* (2006.01)

(52) U.S. Cl.
CPC .............. *G06F 13/28* (2013.01); *G06F 17/16* (2013.01); *H03M 7/30* (2013.01)

(58) Field of Classification Search
CPC ........... G06F 13/28; G06F 17/16; H03M 7/30
See application file for complete search history.

(56) References Cited

U.S. PATENT DOCUMENTS

| | | | |
|---|---|---|---|
| 9,721,203 B1* | 8/2017 | Young | G06N 3/08 |
| 2007/0204133 A1* | 8/2007 | Taniuchi | G06F 9/30181 |
| | | | 712/209 |

(Continued)

FOREIGN PATENT DOCUMENTS

| CN | 1947107 A | 4/2007 |
|---|---|---|
| CN | 106954002 A | 7/2017 |

(Continued)

OTHER PUBLICATIONS

Aimar et al., "NullHop: A Flexible Convolutional Neural Network Accelerator Based on Sparse Representations of Feature Maps," ArXiv:1706.01406v2 [cs.CV], Mar. 2018, 13 pages.

(Continued)

*Primary Examiner* — Henry Tsai
*Assistant Examiner* — John B Roche
(74) *Attorney, Agent, or Firm* — Fish & Richardson P.C.

(57) ABSTRACT

The present disclosure discloses example operation accelerators and compression methods. One example operation accelerator performs operations, including storing, in a first buffer, first input data. In a second buffer, weight data can be stored. A computation result is obtained by performing matrix multiplication on the first input data and the weight data by an operation circuit connected to the input buffer and the weight buffer. The computation result is compressed by a compression module to obtain compressed data. The compressed data can be stored into a memory outside the operation accelerator by a direct memory access controller (DMAC) connected to the compression module.

20 Claims, 7 Drawing Sheets

(56) References Cited

U.S. PATENT DOCUMENTS

| | | | | |
|---|---|---|---|---|
| 2015/0199963 A1* | 7/2015 | Maaninen | ............... | G10L 15/16 |
| | | | | 704/232 |
| 2016/0379115 A1* | 12/2016 | Burger | ................ | G06F 15/7803 |
| | | | | 706/25 |
| 2018/0218518 A1* | 8/2018 | Yan | .......................... | G06T 9/002 |
| 2019/0228037 A1* | 7/2019 | Nicol | ..................... | G06N 3/084 |
| 2020/0159812 A1* | 5/2020 | Zarar | ...................... | G06F 17/16 |

FOREIGN PATENT DOCUMENTS

| | | |
|---|---|---|
| CN | 107341544 A | 11/2017 |
| CN | 108416434 A | 8/2018 |

OTHER PUBLICATIONS

Extended European Search Report issued in European Application No. 18935203.2 dated Aug. 4, 2021, 7 pages.

Lin et al., "Supporting Compressed-Sparse Activations and Weights on SIMD-like Accelerator for Sparse Convolutional Neural Networks," 2018 23rd Asia and South Pacific Design Automation Conference (ASP-DAC), Jan. 2018, 6 pages.

Rhu et al., "Compressing DMA Engine: Leveraging Activation Sparsity for Training Deep Neural Networks," ArXiv:1705.01626v1 [cs.LG], May 2017, 14 pages.

PCT International Search Report and Written Opinion issued in International Application No. PCT/CN2018/109117 dated Jun. 27, 2019, 15 pages (with English translation).

\* cited by examiner

OPERATION ACCELERATOR AND COMPRESSION METHOD

CROSS-REFERENCE TO RELATED APPLICATIONS

This application is a continuation of International Application No. PCT/CN2018/109117, filed on Sep. 30, 2018, the disclosure of which is hereby incorporated by reference in its entirety.

TECHNICAL FIELD

This application relates to data computing technologies in the artificial intelligence (AI) field, and in particular, to an operation accelerator, a processing apparatus, a compression method, and a processing method.

BACKGROUND

With excellent performance of a convolutional neural network in image classification, image recognition, audio recognition, and other related fields, the convolutional neural network becomes a research and development hotspot in the academic and industrial circles. Using an AI operation accelerator to perform operation acceleration on the convolutional neural network can improve running efficiency of a convolutional neural network-related application and shorten execution time of the convolutional neural network-related application, which is a current research hotspot.

The convolutional neural network may be used to identify a specific feature in an input image. The input image usually needs to pass through at least four layers in the convolutional neural network: a convolution (Cony) layer, a rectified linear unit (also referred to as an activation function) layer, a pooling layer and a fully connected (FC) layer. A function of the convolution (Cony) layer is to perform feature recognition on input data (namely, data at the input image) by using a plurality of filters. Each filter has a scanning scope that is used to scan data information in a specific region of the input image. A computation result of the current Conv layer is input to a next layer (such as the Relu layer, the Pooling layer, or the FC layer) for processing. The Relu layer performs an operation similar to a MAX(0, x) operation on the input data. To be specific, the Relu layer compares each value in the input data with 0. If a value is greater than 0, the value is reserved. If a value is less than 0, the value is set to 0. The Relu layer improves a sparse rate of the input data (percentage of a quantity of 0s in a total quantity of the data) without changing a size of the input data. A function of the pooling layer is downsampling. To be specific, the pooling layer extracts data in interlaced rows and columns from a two-dimensional matrix of each layer of the input data, to reduce the size of the input data. The FC layer is similar to the Conv layer. The only difference is that a filter at the FC layer does not scan a small region of the input data, but scans the entire input data at one time and outputs a value. There are a plurality of filters at the FC layer, corresponding to a plurality of different specific image features. The output value is equivalent to a "score", and is used to indicate a "possibility" that the input data includes these features.

A core of the AI operation accelerator is Conv and FC operations. On most neural networks, a computation amount of the Conv and FC operations accounts for more than 90% of a computation amount of an entire network. Therefore, performance of the Conv and FC operations determines overall performance of the AI operation accelerator. When the AI operation accelerator implements the Conv and FC operations, because a large amount of weight data is involved, the weight data cannot be all stored in an on-chip buffer. Therefore, during inference, the weight data needs to be imported from an external memory of the operation accelerator to the operation accelerator to complete computation. In addition, after performing an operation at a previous layer of the neural network, the AI operation accelerator obtains a relatively large amount of data of a computation result, and it is difficult to store the computation result in the on-chip buffer. Therefore, the computation result at the previous layer needs to be exported to the external memory of the AI operation accelerator. When the AI operation accelerator needs to perform computation at a next layer of the neural network, the computation result of the previous layer is then imported from the memory as input data for computation.

Both importing and exporting the input data occupy input/output (I/O) bandwidth of the AI operation accelerator. If the I/O bandwidth becomes a bottleneck, a computing function of the AI operation accelerator is unavailable, decreasing the overall performance of the AI operation accelerator.

SUMMARY

Embodiments of this application provide an operation accelerator, a processing apparatus, a compression method, and a processing method, to reduce I/O bandwidth of an operation accelerator and improve computing performance of the operation accelerator.

To achieve the foregoing objective, the embodiments of this application provide the following technical solutions.

According to a first aspect, an embodiment of this application provides an operation accelerator, including:

a first buffer, configured to store first input data; a second buffer, configured to store weight data; an operation circuit connected to the first buffer and the second buffer, configured to perform matrix multiplication on the first input data and the weight data to obtain a computation result; a compression module, configured to compress the computation result to obtain compressed data; and a direct memory access controller (DMAC) connected to the compression module, configured to store the compressed data in a memory outside the operation accelerator.

The first buffer is an input buffer in the operation accelerator, and the second buffer is a weight buffer memory in the operation accelerator.

Because the compression module is added to the operation accelerator, a data amount of the computation result transferred from the operation accelerator to the memory outside the operation accelerator is reduced, I/O bandwidth of the operation accelerator is reduced, and computing performance of the operation accelerator is improved.

In an optional implementation, the operation accelerator further includes:

a decompression module connected to the DMAC and the first buffer, configured to receive the compressed data obtained by the DMAC from the memory, decompress the compressed data, and store the decompressed data in the first buffer as second input data; where the operation circuit is further configured to obtain the second input data from the first buffer to perform matrix multiplication.

Because the decompression module is added to the operation accelerator, a data amount of the computation result transferred from the memory to the operation accelerator for next computation is reduced, the I/O bandwidth of the operation accelerator is reduced, and the computing performance of the operation accelerator is improved.

In an optional implementation, the operation accelerator further includes:

a third buffer, configured to store a control instruction, where the control instruction is used to instruct whether to compress and decompress the computation result, where the third buffer is an instruction fetch buffer in the operation accelerator; and a controller connected to the third buffer, configured to obtain the control instruction from the third buffer, parse the control instruction, and when the control instruction instructs to compress and decompress the computation result, control the compression module to compress the computation result to obtain the compressed data, and control the decompression module to decompress the obtained compressed data.

In an optional implementation, the operation accelerator further includes:

a fourth buffer connected to the operation circuit, configured to store the computation result of the operation circuit, where the fourth buffer is a unified buffer in the operation accelerator; and the controller is further configured to: when the control instruction instructs not to compress or decompress the computation result, control the DMAC to store the computation result in the fourth buffer into the memory, and control the DMAC to store the computation result in the memory into the first buffer.

Because the controller in the operation accelerator determines whether to start compression and decompression functions, this can avoid starting compression and decompression on a computation result of computation on input data with a relatively low sparse rate on a neural network. This improves a compression gain and a decompression gain.

In an optional implementation, the operation accelerator further includes:

a third buffer, configured to store a control instruction, where the control instruction is used to instruct whether to compress and decompress the computation result; a controller connected to the third buffer, configured to obtain the control instruction from the third buffer, and distribute the control instruction to the compression module and the decompression module; the compression module is configured to parse the control instruction, and when the control instruction instructs to compress the computation result, compress the computation result to obtain the compressed data; and the decompression module is configured to parse the control instruction, and when the control instruction instructs to decompress the computation result, decompress the obtained compressed data.

Because the compression module in the operation accelerator determines whether to start compression, this can avoid starting compression on a computation result of computation on input data with a relatively low sparse rate on a neural network. This improves a compression gain. In addition, the decompression module in the operation accelerator determines whether to start decompression, this can avoid starting decompression on a computation result of computation on the input data with the relatively low sparse rate on the neural network. This improves a decompression gain.

In an optional implementation, the compression module is further configured to: when the control instruction instructs not to compress the computation result, control the DMAC to store the computation result in the memory; and the decompression module is further configured to: when the control instruction instructs not to decompress the computation result, control the DMAC to store the computation result in the memory into the first buffer.

In an optional implementation, the compression module includes a fragmentation module and at least one compression engine.

The fragmentation module is configured to perform fragmentation processing on the computation result to obtain at least one sub-computation result. Each compression engine in the at least one compression engine is configured to compress one sub-computation result in the at least one sub-computation result to obtain sub-compressed data. A sum of the sub-compressed data generated by each compression engine in the at least one compression engine forms the compressed data.

Fragmentation processing is performed on to-be-compressed data, and then compression processing is performed on each piece of the sub-compressed data obtained after the fragmentation. This improves compression efficiency.

In an optional implementation, each of the at least one compression engine is specifically configured to:

compress the sub-computation result to obtain a sub-compression result; compare the sub-compression result with the sub-computation result; when the sub-compression result is greater than the sub-computation result, use the sub-computation result as the sub-compressed data; or when the sub-compression result is not greater than the sub-computation result, use the sub-compression result as the sub-compressed data.

In an optional implementation, each of the at least one compression engine is further configured to:

when the sub-compression result is greater than the sub-computation result, generate a compression failure identifier corresponding to the sub-compressed data, where the compression failure identifier is controlled by the DMAC to be stored in the memory; and when the sub-compression result is not greater than the sub-computation result, generate a compression success identifier corresponding to the sub-compressed data, where the compression success identifier is controlled by the DMAC to be stored in the memory.

In an optional implementation, the decompression module is specifically configured to:

receive the sub-compressed data obtained by the DMAC from the memory; when an identifier corresponding to the sub-compressed data is the compression failure identifier, store the sub-compressed data into the first buffer as the second input data; or when an identifier corresponding to the sub-compressed data is the compression success identifier, decompress the sub-compressed data, and store the decompressed data into the first buffer as the second input data.

According to a second aspect, an embodiment of this application provides a processing apparatus, including:

a determining module, configured to determine, based on a sparse rate of input data at an $i^{th}$ layer of a neural network, whether an operation accelerator compresses and decompresses a computation result obtained after performing computation on the input data at the $i^{th}$ layer, where $1 \le i \le N$, and N is a quantity of layers of the neural network, and the operation accelerator is a coprocessor outside the processing apparatus; and a compilation module, configured to generate a control instruction based on a determining result of the determining module, where the control instruction is used to instruct whether the operation accelerator compresses and decompresses the computation result.

The processor generates the control instruction that instructs the operation accelerator to perform compression and decompression based on the sparse rate of the input data on the neural network. This can prevent the operation accelerator from starting compression and decompression on a computation result of computation on input data with a relatively low sparse rate on the neural network, and a compression gain and a decompression gain are improved.

In an optional implementation, the determining module is specifically configured to:

when the sparse rate of the input data at the $i^{th}$ layer of the neural network is greater than a threshold, determine that the operation accelerator compresses the computation result, and decompresses the computation result when the computation result is used as input data at an $(i+1)^{th}$ layer for $(i+1)^{th}$ layer computation; or when the sparse rate of the input data at the $i^{th}$ layer of the neural network is not greater than a threshold, determine that the operation accelerator does not compress the computation result, and does not decompress when the computation result is used as input data at an $(i+1)^{th}$ layer for $(i+1)^{th}$ layer computation.

In an optional implementation, the threshold is determined based on an input/output (I/O) bandwidth gain and a power consumption cost. The I/O bandwidth gain is used to indicate I/O bandwidth reduced by the operation accelerator by performing compression and decompression on the computation result. The power consumption cost is used to indicate power consumption increased by the operation accelerator by performing the compression and the decompression on the computation result.

According to a third aspect, an embodiment of this application provides an operation acceleration processing system, including:

a processor, configured to generate a control instruction, where the control instruction is used to indicate whether an operation accelerator compresses and decompresses a computation result obtained after performing computation on input data at an $i^{th}$ layer of a neural network, where $1 \le i \le N$, and N is a quantity of layers of the neural network; and the operation accelerator is configured to perform the computation on the input data at the $i^{th}$ layer of the neural network to obtain the computation result, obtain the control instruction generated by the processor, and determine whether to compress and decompress the computation result based on the control instruction.

In an optional implementation, the operation accelerator includes:

an operation circuit, configured to perform the computation on the input data at the $i^{th}$ layer of the neural network to obtain the computation result; a controller, configured to control, based on the obtained control instruction, a compression module to compress the computation result, and a decompression module to decompress the computation result; the compression module is configured to compress the computation result; and the decompression module is configured to decompress the computation result.

In a possible implementation, the operation acceleration processing system further includes:

a memory, configured to store the control instruction generated by the processor; correspondingly, the processor is further configured to store the generated control instruction in the memory; and the operation accelerator is further configured to obtain the control instruction from the memory.

According to a fourth aspect, an embodiment of this application provides a compression method, where the compression method is applied to an operation accelerator. The operation accelerator includes a first buffer and a second buffer. The method includes:

performing matrix multiplication on first input data obtained from the first buffer and weight data obtained from the second buffer, to obtain a computation result; compressing the computation result to obtain compressed data; and storing the compressed data in a memory outside the operation accelerator.

In an optional implementation, the compression method further includes:

obtaining the compressed data from the memory; decompressing the compressed data, and storing the decompressed data into the first buffer as second input data; and performing matrix multiplication on the second input data obtained from the first buffer.

In an optional implementation, the compression method includes:

obtaining a control instruction, where the control instruction is used to instruct whether to compress and decompress the computation result; parsing the control instruction; and the compressing the computation result to obtain compressed data includes: when the control instruction instructs to compress the computation result, compressing the computation result to obtain the compressed data.

Correspondingly, the decompressing the compressed data includes: when the control instruction instructs to decompress the computation result, decompressing the compressed data.

In an optional implementation, the compression method further includes:

when the control instruction instructs not to compress or decompress the computation result, storing the computation result in the memory, and storing the computation result obtained from the memory into the first buffer.

According to a fifth aspect, an embodiment of this application provides a compression method, where the compression method is applied to an operation accelerator. The operation accelerator includes a first buffer and a second buffer. The compression method includes:

performing matrix multiplication on first input data obtained from the first buffer and weight data obtained from the second buffer, to obtain a computation result; obtaining a control instruction, where the control instruction is used to instruct whether to compress and decompress the computation result; when the control instruction instructs to compress the computation result, compressing the computation result to obtain compressed data, and storing the compressed data in a memory outside the operation accelerator; and when the control instruction instructs not to compress the computation result, storing the computation result in the memory outside the operation accelerator.

In an optional implementation, the compression method further includes:

when the control instruction instructs to decompress the computation result, decompressing the compressed data obtained from the memory, and performing matrix multiplication on the decompressed data as second input data; and when the control instruction instructs not to decompress the computation result, performing matrix multiplication on the computation result obtained from the memory as the second input data.

According to a sixth aspect, an embodiment of this application provides a processing method, applied to a processing apparatus, including:

determining, based on a sparse rate of input data at an $i^{th}$ layer of a neural network, whether an operation accelerator compresses and decompresses a computation result obtained after performing computation on the input data at the $i^{th}$ layer, where $1 \leq i \leq N$, and N is a quantity of layers of the neural network, and the operation accelerator is a coprocessor outside the processing apparatus; and generating a control instruction, where the control instruction is used to instruct whether the operation accelerator compresses and decompresses the computation result.

In an optional implementation, the determining, based on a sparse rate of input data at an $i^{th}$ layer of a neural network, whether an operation accelerator compresses and decompresses a computation result obtained after performing computation on the input data at the $i^{th}$ layer comprises:

when the sparse rate of the input data at the $i^{th}$ layer of the neural network is greater than a threshold, determining that the operation accelerator compresses the computation result, and decompresses the computation result when the computation result is used as input data at an $(i+1)^{th}$ layer for $(i+1)^{th}$ layer computation; or when the sparse rate of the input data at the $i^{th}$ layer of the neural network is not greater than a threshold, determining that the operation accelerator does not compress the computation result, and does not decompress the computation result when the computation result is used as input data at an $(i+1)^{th}$ layer for $(i+1)^{th}$ layer computation.

In an optional implementation, the threshold is determined based on an input/output (I/O) bandwidth gain and a power consumption cost. The I/O bandwidth gain is used to indicate I/O bandwidth reduced by the operation accelerator by performing compression and decompression on the computation result. The power consumption cost is used to indicate power consumption increased by the operation accelerator by performing the compression and the decompression on the computation result.

An embodiment of this application further provides a processing apparatus. The processing apparatus includes: a memory, configured to store an instruction; and a processor, configured to read the instruction in the memory and perform the processing method in any one of the sixth aspect or the possible implementations of the sixth aspect.

An embodiment of this application further provides a computer storage medium. The storage medium stores a software program, and the software program is read and executed by one or more processors, the processing method in any one of the sixth aspect or the possible implementations of the sixth aspect is implemented.

An embodiment of this application further provides a computer program product including an instruction. When the computer program product runs on a computer, the computer is enabled to perform the processing method in the sixth aspect or the possible implementations of the sixth aspect.

BRIEF DESCRIPTION OF DRAWINGS

To describe the technical solutions in the embodiments of this application or in the background more clearly, the following briefly describes the accompanying drawings required for describing the embodiments of this application or the background.

DESCRIPTION OF EMBODIMENTS

The following describes the technical solutions in the embodiments of this application with reference to the accompanying drawings in the embodiments of this application.

The operation accelerator provided in the embodiments of the present invention may be applied to fields such as machine learning, deep learning, and a convolutional neural network, or may be applied to fields such as digital image processing and digital signal processing, or may be applied to other fields related to matrix multiplication. In this application, the operation accelerator may be a neural network processing unit (NPU) or another processor, and may be applied to a device that can perform a convolution operation, such as a mobile phone, a tablet computer, a server, or a wearable device.

First, related terms used in this application are explained.

Input data may be original data that is initially input to the operation accelerator to perform an inference operation, for example, image data and voice data. Alternatively, the input data may be intermediate data generated in a process in which the operation accelerator performs a neural network operation. Because an amount of the intermediate data is usually relatively large, therefore the operation accelerator stores the intermediate data obtained through computation at a previous layer of a neural network in an external memory, reads the intermediate data from the memory when performing computation at a next layer of the neural network, and loads the intermediate data to the operation accelerator for computation.

Weight data is weight data obtained after a neural network is trained. A training process of the neural network is a process of continuously adjusting a weight value.

Computation result refers to intermediate data or final data generated in a process in which the operation accelerator performs a neural network operation, and may be data output after an operation unit in the operation accelerator performs an operation, or may be data obtained after a vector calculation unit performs an operation again on the data output by the operation unit. It should be noted that the computation result is also input data, and a computation result of a previous layer of the neural network is usually used as input data for computation of a next layer of the neural network.

Data sparse rate generally refers to a percentage of data with missing or 0 values in a data set in total data.

Figure 1:
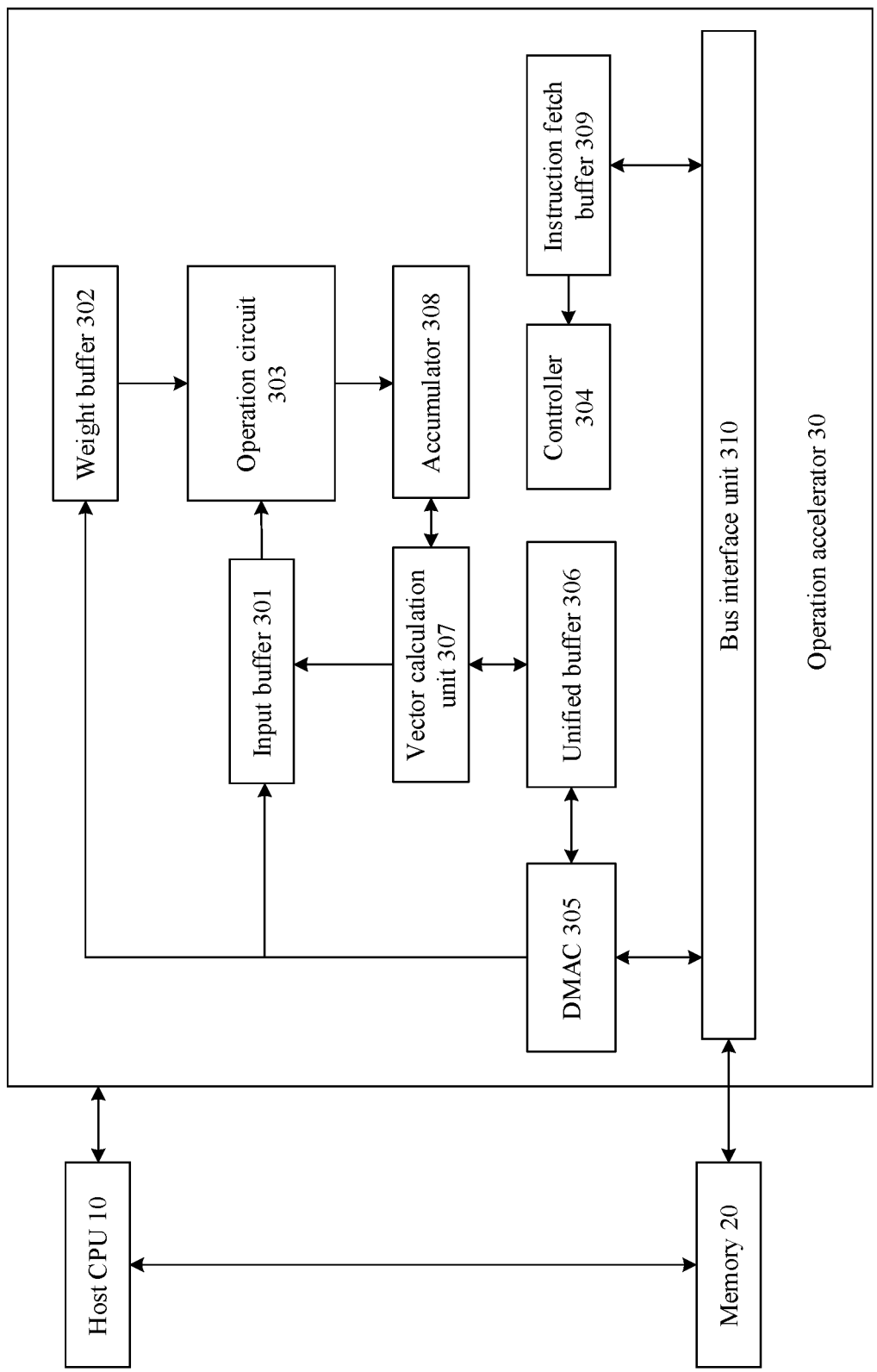
FIG. 1 is a diagram of a structure of an operation accelerator according to this application.

FIG. 1 is a diagram of a hardware structure of an operation accelerator according to this application. The operation accelerator 30 is mounted to a host central processing unit (Host CPU) 10 as a coprocessor, and the host CPU 10 allocates a task. A core part of the operation accelerator 30 is an operation circuit 303. A controller 304 controls the operation circuit 303 to extract data from an input buffer 301 or a weight buffer 302 and perform an operation.

In some implementations, the operation circuit 303 includes a plurality of process engines (PE). In some implementations, the operation circuit 303 is a two-dimensional systolic array. The operation circuit 303 may alternatively be a one-dimensional systolic array or another electronic circuit that can perform mathematical operations such as multiplication and addition. In some implementations, the operation circuit 303 is a general-purpose matrix processor.

For example, it is assumed that there are an input matrix A, a weight matrix B, and an output matrix C. The operation circuit fetches data corresponding to the matrix B from the weight buffer 302 and buffers the data on each PE of the operation circuit. The operation circuit fetches data corresponding to the matrix A from the input buffer 301, and performs matrix multiplication on the data corresponding to the matrix B, to obtain a part of a result or a final result of the matrix, and stores the result in an accumulator 308.

A vector calculation unit 307 may perform further processing on an output of the operation circuit 303, such as vector multiplication, vector addition, an exponential operation, a logarithmic operation, or value comparison. For example, the vector calculation unit 307 may be specifically configured to perform network computation at a non-convolution/non-FC layer of a convolutional neural network, such as pooling, batch normalization, or local response normalization.

In some implementations, the vector calculation unit 307 can store a processed output vector in a unified buffer 306. For example, the vector calculation unit 307 may apply a non-linear function to the output of the operation circuit 303, for example, to a vector of an accumulated value, to generate an activation value. In some implementations, the vector calculation unit 307 generates a normalized value, a combined value, or both. In some implementations, the processed output vector can be used as an activation input of the operation circuit 303, for example, can be used at a subsequent layer of the neural network.

The unified buffer 306 is configured to store an output computation result and input data at some layers.

A direct memory access controller (DMAC) 305 is configured to store input data (or referred to as an input matrix) in a memory 20 outside the operation accelerator 30 into the input buffer 301 and the unified buffer 306, and store weight data (or referred to as a weight matrix) into the weight buffer 302, or store data in the unified buffer 306 into the memory 20.

A bus interface unit (BIU) 310 is configured to interact between the host CPU 10, the DMAC 305, and an instruction fetch buffer 309 through a bus.

The instruction fetch buffer 309 connected to the controller 304 is configured to store an instruction used by the controller 304.

The controller 304 is configured to invoke the instruction buffered in the instruction fetch buffer 309, to control a working process of the operation accelerator 30.

Generally, the unified buffer 306, the input buffer 301, the weight buffer 302, and the instruction fetch buffer 309 are all on-chip buffers, and the memory 20 is an external memory of the operation accelerator 30. The memory 20 may be a double data rate synchronous dynamic random access memory (DDR SDRAM), a high bandwidth memory (HBM), or another readable and writable memory.

In this application, the input buffer is a first buffer, the weight buffer is a second buffer, the instruction fetch buffer is a third buffer, and the unified buffer is a fourth buffer.

When the operation accelerator implements convolution and FC operations, because a large amount of weight data is involved in the operations, the weight data cannot be all stored in the weight buffer. Therefore, during the operation, the operation accelerator needs to import the weight data from the memory in real time to perform computation. In addition, after performing an operation at a previous layer of the neural network, the operation accelerator obtains a relatively large data amount of a computation result, and it is difficult to store the computation result in the unified buffer. Therefore, the computation result at the previous layer needs to be exported to the memory. When the operation accelerator needs to perform computation at a next layer of the neural network, the computation result of the previous layer is then imported from the memory as the input data for computation.

Both importing and exporting the computation result occupy input/output (I/O) bandwidth of the operation accelerator. If the I/O bandwidth becomes a bottleneck, a computing function of the operation accelerator is unavailable, decreasing computing performance of the operation accelerator.

Figure 2:
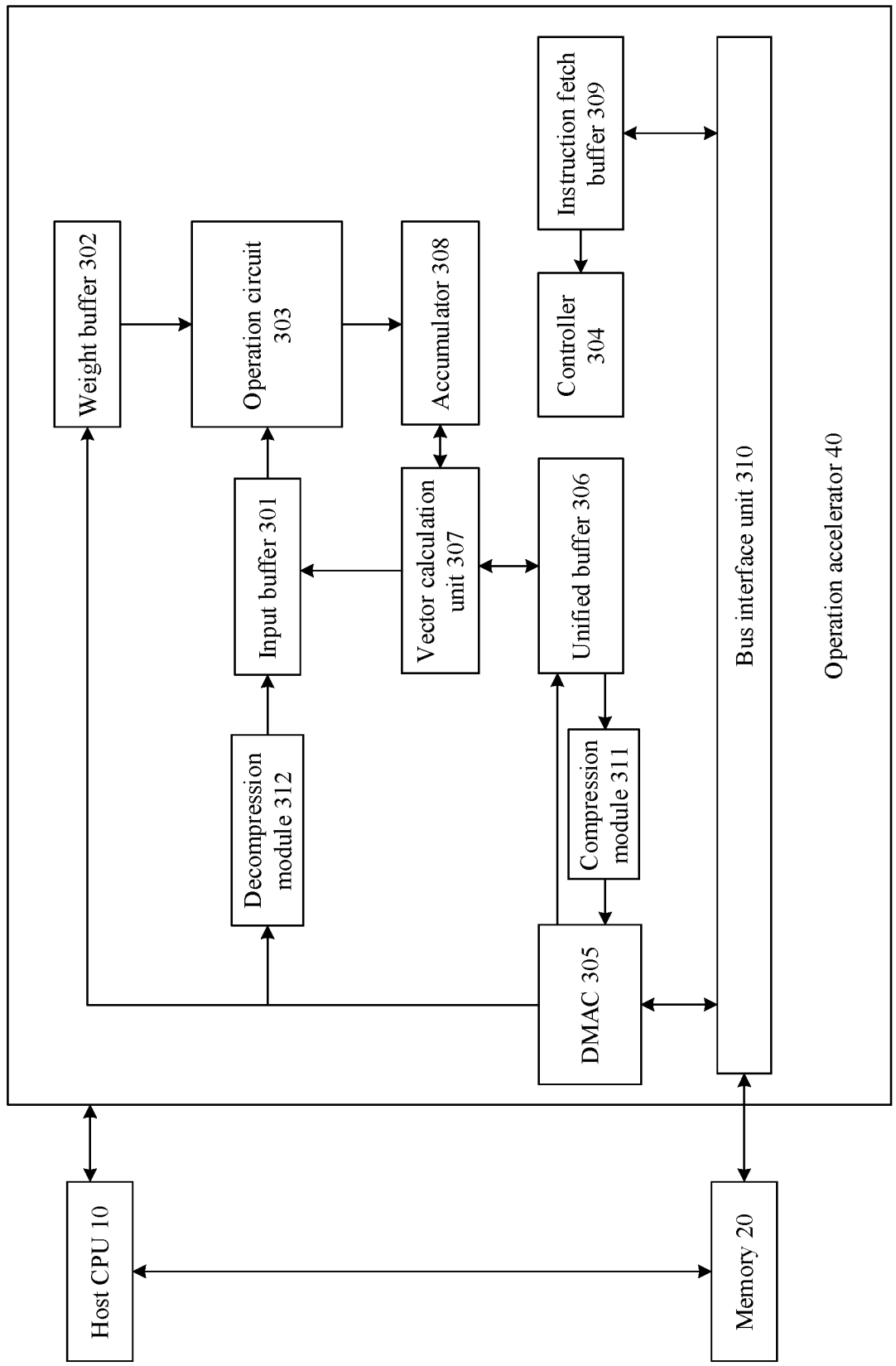
FIG. 2 is a diagram of a structure of an operation accelerator according to an embodiment of this application.

FIG. 2 is a diagram of a hardware structure of an operation accelerator 40 according to an embodiment of this application. Compared with the operation accelerator 30 shown in FIG. 1, the operation accelerator 40 mainly includes a compression module 311 and a decompression module 312.

An input buffer 301 stores input data, a weight buffer 302 stores weight data, and an operation circuit 303 performs matrix multiplication on the input data obtained from the input buffer 301 and the weight data obtained from the weight buffer 302 to obtain a computation result. The computation result may be an intermediate result or a final result, and the computation result is stored in an accumulator 308. A vector calculation unit 307 may extract the computation result from the accumulator 308 for further processing, such as vector multiplication, vector addition, an exponential operation, a logarithmic operation, or value comparison. In addition, the vector calculation unit 307 stores the processed computation result in a unified buffer 306.

The compression module 311 obtains the computation result from the unified buffer 306, and compresses the computation result to obtain compressed data. Then, a DMAC 305 stores the compressed data output by the compression module 311 in a memory 20.

Further, the compressed data is a computation result obtained after the operation accelerator 40 performs computation on a specific layer of a neural network. The compressed data may be used as input data for next computation performed by the operation accelerator 40. Therefore, the operation accelerator 40 further includes the decompression module 312, configured to obtain the compressed data from the memory 20 by using the DMAC 305, decompress the compressed data to obtain the decompressed data, and store the decompressed data in the input buffer 301 as the input data. The operation circuit 303 performs the matrix multiplication on the input data obtained from the input buffer 301 and the weight data obtained from the weight buffer 302.

It can be learned from the foregoing that, because the compression module and the decompression module are added to the operation accelerator, a data amount of the computation result transferred from the operation accelerator to the memory is reduced, and a data amount of the computation result transferred from the memory to the operation accelerator for next computation is reduced, and I/O bandwidth of the operation accelerator is reduced, and computing performance of the operation accelerator is improved.

A computation result obtained after first layer data (namely, initial input data) on the neural network is computed in the operation accelerator is used as input data at a second layer. Subsequently, a computation result output by a previous layer is used as input data at a next layer, until a final result is obtained after an operation at a last layer (a fully connected layer) is performed. Because a sparse rate of the first layer data is usually relatively low, compressing the first layer data brings a relatively low I/O bandwidth gain, and also results in a power consumption loss caused by starting a compression function. Consequently, a compression gain is relatively low. However, as a quantity of layers of a neural network is computed, a continuously emerging rectified linear unit (Relu) (also referred to as an activation function) gradually increases a sparse rate of the computation result, and a relatively high sparse rate may increase the I/O bandwidth gain. Therefore, the operation accelerator starts the compression function when computation is performed on a specific layer of the neural network. This maximizes the compression gain of the operation accelerator.

Figure 3:
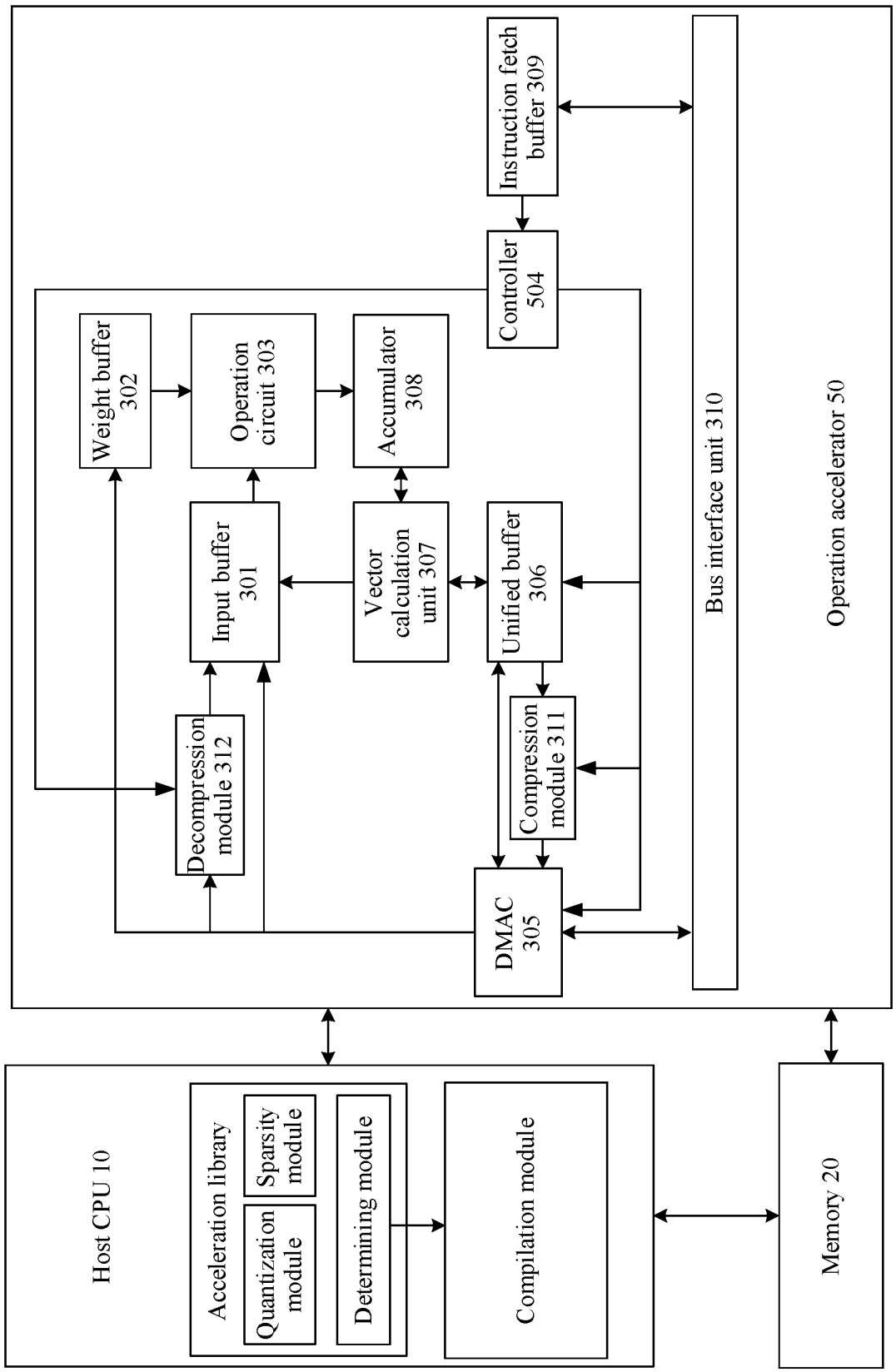
FIG. 3 is a diagram of a structure of an operation accelerator according to another embodiment of this application.

Based on the foregoing considerations, FIG. 3 shows a structure of an operation accelerator 50 according to an embodiment of this application. In the operation accelerator 50, a controller 504 is connected to a compression module 311, a decompression module 312, a unified buffer 306, a DMAC 305, and an instruction fetch buffer 309. The instruction fetch buffer 309 obtains a control instruction from a memory 20, and stores the control instruction. The control instruction is used to instruct whether the operation accelerator 50 compresses a computation result obtained after performing computation on each layer of a neural network, and instruct whether the operation accelerator 50 decompresses a computation result obtained from the memory 20. The controller 504 reads the control instruction from the instruction fetch buffer to control a related component in the operation accelerator 50.

Specifically, the controller 504 obtains the control instruction from the fetch buffer and parses the control instruction. When the control instruction instructs to compress the computation result, the controller 504 controls the compression module 311 to compress the computation result obtained from the unified buffer 306 to obtain the compressed computation result, and the DMAC 305 transfers the compressed computation result to the memory 20. When the control instruction instructs not to compress the computation result, the controller 504 controls the unified buffer 306 to send the computation result to the DMAC 305, and the DMAC 305 transfers the computation result to the memory 20. In this case, the computation result is not compressed by the compression module. It can be learned from the foregoing description that, when the control instruction instructs to compress the computation result, the memory 20 stores the compressed computation result. Because the compressed computation result is further used as input data for computation performed by the operation accelerator 50 on a next layer of the neural network, the controller 504 further needs to control the decompression module 312 to perform decompression.

Specifically, in addition to instructing whether the operation accelerator 50 compresses the computation result of each layer of the neural network, the control instruction is further used to instruct whether the operation accelerator 50 decompresses the computation result obtained from the memory 20. The controller 504 obtains the control instruction from the instruction fetch buffer 309 and parses the control instruction. When the control instruction instructs to decompress the computation result, the controller 504 controls the decompression module 312 to decompress the obtained computation result, and the decompression module 312 stores the decompressed data into the input buffer 301 as input data. When the control instruction instructs not to decompress the computation result, the controller 504 controls the DMAC 305 to directly store the computation result into the input buffer 301 as the input data. In this case, the computation result is not decompressed by the decompression module 312.

The following further describes how the control instruction stored in the memory 20 is generated with reference to FIG. 3.

In addition to the structure of the operation accelerator 50, FIG. 3 also provides a structure of a host CPU 10. The host CPU 10 includes an acceleration library and a compilation module that are implemented by using software. The acceleration library may include a plurality of components, to complete different acceleration optimization operations, for example, a quantization module that quantizes data, and a sparsity module that supports a sparse computing architecture. The compilation module is configured to generate an instruction, to control an operation accelerator to complete a computation operation. In addition to the acceleration library and the compilation module, the host CPU may further include a driver and a task scheduling module (not shown in FIG. 4). The host CPU is connected to the operation accelerator by using the driver and the task scheduling module.

In this embodiment provided in this application, the acceleration library further includes a determining module. The determining module is configured to analyze a feature of a neural network formed after training (the neural network formed after the training is a neural network on which the operation accelerator performs an inference operation), for example, through algorithm analysis or measured data. Then, the determining module deduces a sparse rate of input data at each layer in a neural network process based on the feature of the neural network obtained through analysis, determines whether to compress and decompress the computation result of each layer based on the sparse rate of the input data at each layer, and sends information about whether to compress and decompress the computation result of each layer to the compilation module. The compilation module generates a specific control instruction.

Specifically, the determining module compares a sparse rate of input data at an $i^{th}$ layer on the neural network with a preset threshold. When the sparse rate of the input data at the $i^{th}$ layer of the neural network is greater than the threshold, the determining module determines that a computation result of the $i^{th}$ layer needs to be compressed. In addition, when the computation result of the $i^{th}$ layer is used as input data at an $(i+1)^{th}$ layer for $(i+1)^{th}$ layer computation, the computation result of the $i^{th}$ layer needs to be decompressed. When a sparse rate of the computation result of the $i^{th}$ layer of the neural network is not greater than a threshold, the determining module determines that the computation result of the $i^{th}$ layer does not need to be compressed. When the computation result of the $i^{th}$ layer is used as input data at an $(i+1)^{th}$ layer for $(i+1)^{th}$ layer computation, the computation result of the $i^{th}$ layer does not need to be decompressed. $1 \leq i \leq N$, and n is a quantity of layers of the neural network.

The foregoing threshold may be determined based on an I/O bandwidth gain and a power consumption cost. The I/O bandwidth gain is I/O bandwidth reduced by the operation accelerator by performing compression and decompression on the computation result. The power consumption cost refers to power consumption increased by the operation accelerator by performing the compression and the decompression on the computation result.

Specifically, the threshold may be determined in advance. For example, in a pre-test, when the sparse rate of the input data is equal to a critical value, and the I/O bandwidth gain brought by the operation accelerator by starting the compression and the decompression is equal to the power consumption cost, the critical value may be used as the threshold. Certainly, in actual implementation, considering that more gains of the I/O bandwidth are expected, the critical value may be adjusted to determine the threshold. A method for determining the threshold is not limited in this application.

It should be noted that for different neural network models, the preset thresholds may be different.

The compilation module is configured to perform instruction decoding on the information that is about whether to compress and decompress the computation result of each layer and that is obtained from the determining module, to obtain the control instruction. In other words, the control instruction is used to instruct whether the operation accelerator compresses and decompresses the computation result of each layer of the neural network.

It can be learned from the foregoing that, for input data with a relatively low sparse rate on the neural network, if the operation accelerator starts the compression and the decompression, a relatively low I/O bandwidth gain is brought. In addition, there is a power consumption loss caused by starting the compression and decompression functions, and a compression gain is low. In this embodiment of this application, the host CPU controls the operation accelerator to compress and decompress a computation result of a specific layer only when determining that a sparse rate of input data at the layer of the neural network is relatively large. In this case, because an I/O bandwidth gain is relatively large, a part of power consumption loss caused by starting the compression and decompression functions can be canceled, and the compression gain is improved.

In the operation accelerator described in FIG. 3, the controller parses the control instruction stored in the instruction fetch buffer, and performs different control operations on the compression module, the unified buffer, the decompression module, and the DMAC based on a parsing result. In another implementation, the controller may alternatively not parse the control instruction, and delivers parsing of the control instruction to the compression module and the decompression module in the operation accelerator for processing.

Figure 4:
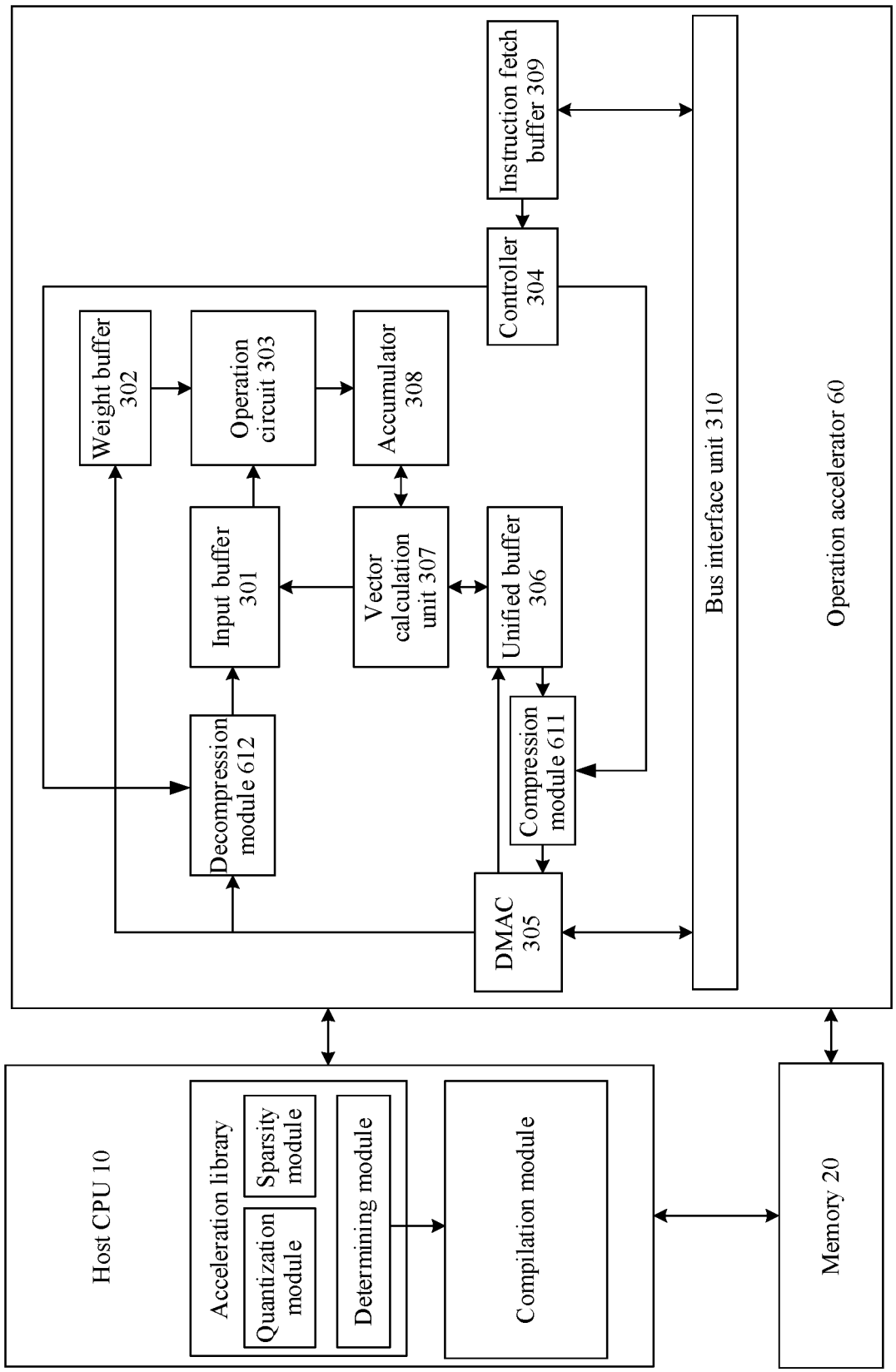
FIG. 4 is a diagram of a structure of an operation accelerator according to another embodiment of this application.

FIG. 4 shows a structure of an operation accelerator 60 according to an embodiment of this application. In the operation accelerator 60, an instruction fetch buffer 309 obtains a control instruction from a memory 20 and stores the control instruction. A controller 304 allocates the control instruction to a compression module 611 and a decompression module 612.

The compression module 611 parses the control instruction, and when the control instruction instructs to compress a computation result, compresses the computation result to obtain the compressed computation result. A DMAC 305 transfers the compressed computation result to the memory. When the control instruction instructs not to compress the computation result, the computation result is directly sent to the DMAC 305, and the DMAC 305 transfers the computation result to the memory 20.

Similarly, the decompression module 612 parses the control instruction, and when the control instruction instructs to decompress the computation result obtained from the memory 20, decompresses the computation result, and stores the decompressed data into an input buffer 301 as input data. When the control instruction instructs not to decompress the computation result obtained from the memory 20, the decompression module 612 directly stores the obtained computation result in the input buffer 301 as the input data.

The following describes how the compression module 311 in the operation accelerator mentioned in the foregoing embodiment implements a compression function.

To improve compression efficiency of the compression module 311, a fragmentation module 3110 is usually introduced into the compression module 311 when the compression module 311 is designed. The fragmentation module 3110 is configured to perform fragmentation processing on the computation result received by the compression module 311, and separately perform compression on each fragment.

Figure 5:
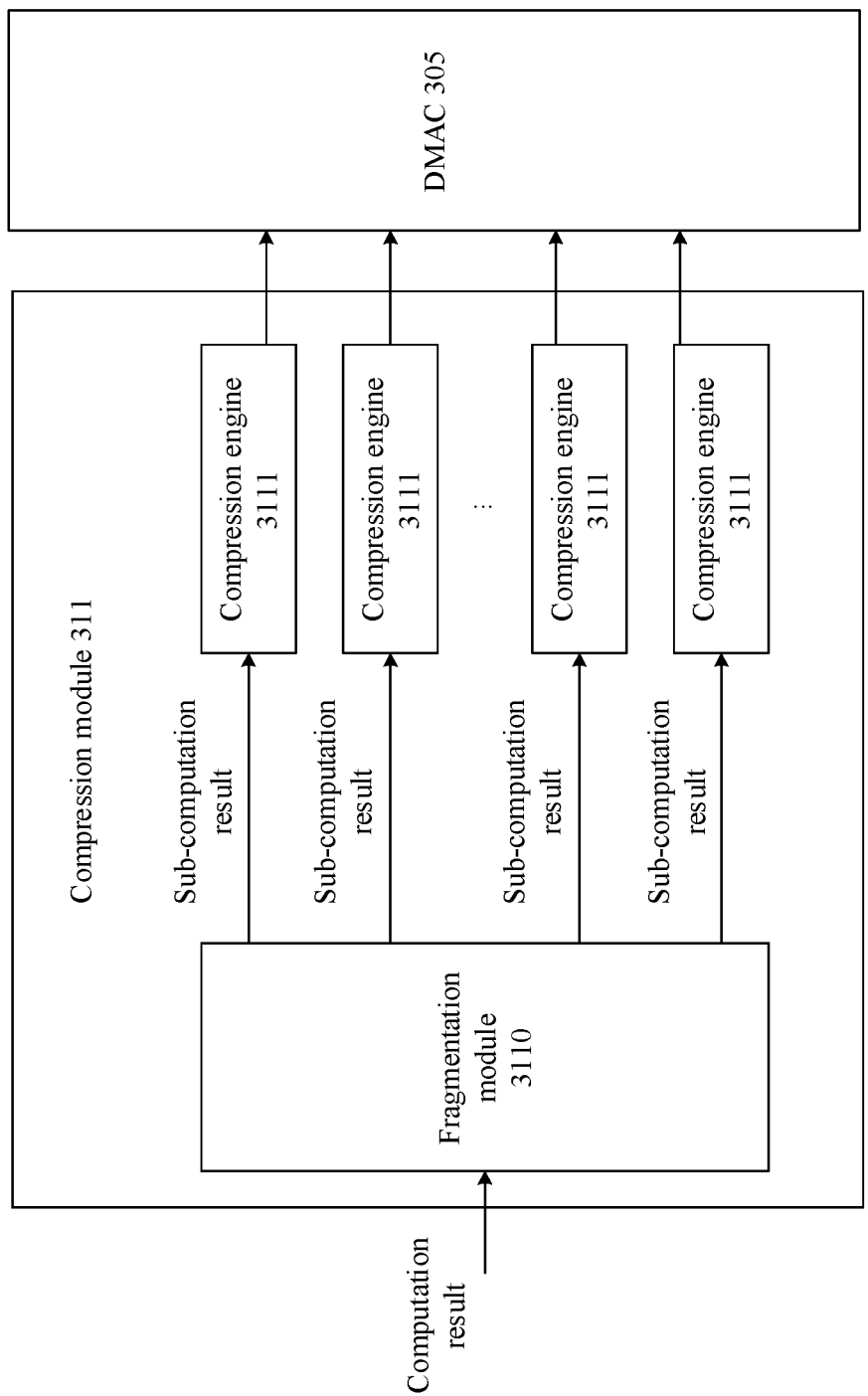
FIG. 5 is a diagram of a structure of a compression module applied to an operation accelerator according to an embodiment of this application.

Specifically, FIG. 5 is a diagram of a structure of a compression module 311 according to this application. The compression module 311 includes a fragmentation module 3110 and at least one compression engine 3111. The fragmentation module 3110 is configured to perform fragmentation processing on a received computation result to obtain at least one sub-computation result. Each compression engine 3111 is configured to compress one sub-computation result in the at least one sub-computation result to obtain sub-compressed data. A sum of the sub-compressed data generated by each compression engine in the at least one compression engine forms compressed data output by the compression module 311.

It should be noted that a compression algorithm used in the compression engine 3111 is not limited in this application. Common compression algorithms in the industry include entropy coding, run-length coding, and the like. Different compression algorithms have respective applicable scenarios. For example, the compression engine may perform compression based on a 0 value in data. Because the compression module runs on a hardware logic circuit of an operation accelerator 40, a resource, power consumption, performance, and the like of hardware need to be considered in selecting the compression algorithm. A type of the compression algorithm used by the compression engine is not limited in this application. In addition, in the example in FIG. 3, a computation result is divided into four sub-computation results, and each sub-computation result is allocated to one corresponding compression engine for compression. In other words, there are four compression engines in total. In actual implementation, a quantity of compression engines may be determined based on performance of a single compression engine, a performance requirement of an operation accelerator, and the like. The quantity of compression engines is not limited in this application. The quantity of compression engines may not be in a one-to-one correspondence with a quantity of sub-computation results. For example, one compression engine may process two or more sub-computation results.

Further, after the compression engine 3111 compresses to-be-compressed data, a size of the compressed data may be greater than a size of the to-be-compressed data. In this case, if the compressed data is transferred to a memory for storage, it is not conducive to reducing I/O bandwidth of the operation accelerator. Therefore, to further reduce the I/O bandwidth of the operation accelerator, the compression engine 3111 may be further designed.

Specifically, each compression engine 3111 compresses the received sub-computation result to obtain a sub-compression result, and compares the sub-compression result with the sub-computation result. When the sub-compression result is greater than the sub-computation result, the sub-computation result is used as output sub-compressed data, and a compression failure identifier corresponding to the sub-compressed data is generated. In this case, because the output sub-compressed data is data that is not compressed, the compression fails. When the sub-compression result is not greater than the sub-computation result, the sub-compression result is used as the output sub-compressed data, and a compression success identifier corresponding to the sub-compressed data is generated. In this case, because the output sub-compressed data is data that is compressed, the compression succeeds. The compression failure identifier and the compression success identifier are stored in the memory by using a DMAC.

It should be noted that, for a scenario in which a size of the sub-compression result is equal to a size of the sub-computation result, there may be two implementations. In a first implementation, as described above, the compression engine 3111 may output the sub-compression result as the sub-compressed data to the DMAC. In this case, although decompression of the sub-compressed data is added in next computation, the compression engine 3111 can be prevented from reading the sub-computation result again and then outputting the sub-computation result to the DMAC. This reduces power consumption caused by reading the sub-computation result. In a second implementation, alternatively, the compression engine 3111 may directly use the sub-computation result as the sub-compressed data, and output the sub-compressed data to the DMAC. In this case, the sub-compressed data is the data that is not compressed. Although the compression engine 3111 reads the sub-computation result again, decompression of the sub-compressed data may be avoided in next computation. This reduces power consumption caused by decompression of the sub-compressed data. Therefore, in the scenario in which the size of the sub-compression result is equal to the size of the sub-computation result, the foregoing two implementations have advantages and disadvantages. In actual implementation, an appropriate selection may be made based on the performance requirement of the operation accelerator.

It can be learned from the above that the compression engine in the compression module may encounter compression failure and compression success during the compression. Therefore, in a process of transferring the sub-compressed data stored in the memory to an input buffer, the DMAC 305 adds a decompression module 312. The decompression module 312 may include a plurality of decompression engines, and each decompression engine separately performs decompression on the received sub-compressed data. Specifically, after obtaining the sub-compressed data, each decompression engine identifies an identifier corresponding to the received sub-compressed data. When the identifier corresponding to the sub-compressed data is the compression failure identifier, the decompression engine stores the sub-compressed data in the input buffer as input data. In other words, the decompression is not performed. When the identifier corresponding to the sub-compressed data is the compression success identifier, the decompression engine performs the decompression on the sub-compressed data to obtain decompressed data, and stores the decompressed data in the input buffer as the input data.

It should be noted that a quantity of decompression engines is determined by decompression performance of a single decompression engine, the performance requirement of the operation accelerator, and the like. Coupling between a decompression process and a compression process needs to be considered. In addition, a decompression algorithm used in the decompression engine is an algorithm corresponding to the compression algorithm used by the compression engine in the compression module.

Figure 6:
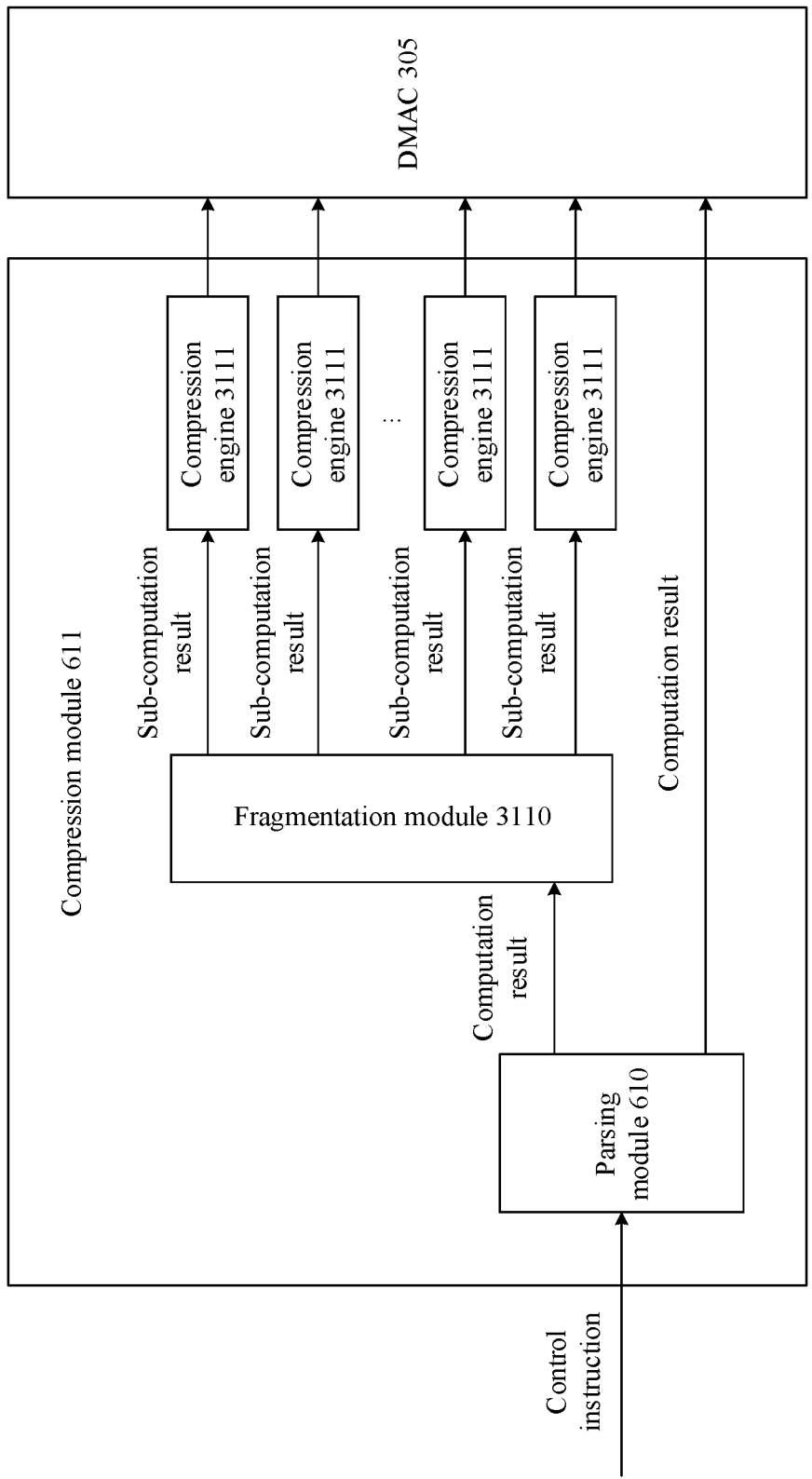
FIG. 6 is a diagram of a structure of another compression module applied to an operation accelerator according to an embodiment of this application.

The following describes how the compression module 611 in the operation accelerator mentioned in the foregoing embodiment implements a compression function. FIG. 6 is a diagram of a structure a compression module 611 according to another embodiment of this application. Compared with the compression module 311 in FIG. 5, a parsing module 610 is mainly added to the compression module 611.

The parsing module 610 is configured to parse a control instruction, and when the control instruction instructs to compress a computation result, provide the computation result to a fragmentation module 3110 for fragmentation. Then, a compression engine 3111 compresses a sub-computation result obtained after the fragmentation and sends the sub-computation result to a DMAC 305. Finally, the DMAC 305 transfers the compressed computation result to a memory 20. Implementation of this part is the same as the implementation of the compression module 311 in FIG. 5. Details are not described herein again. When the control instruction instructs not to compress the computation result, the parsing module 610 directly sends the computation result to the DMAC 305, and the DMAC 305 transfers the computation result to the memory 20.

Correspondingly, a decompression module 612 also has a parsing module. The parsing module is configured to parse the control instruction, and when the control instruction instructs to decompress the computation result obtained from the memory 20, decompress the obtained computation result, and store decompressed data in an input buffer 301 as input data. When the control instruction instructs not to decompress the computation result obtained from the memory 20, the parsing module directly stores the obtained computation result in the input buffer 301 as the input data. A diagram of a structure of the decompression module 612 is not provided in this application.

Figure 7:
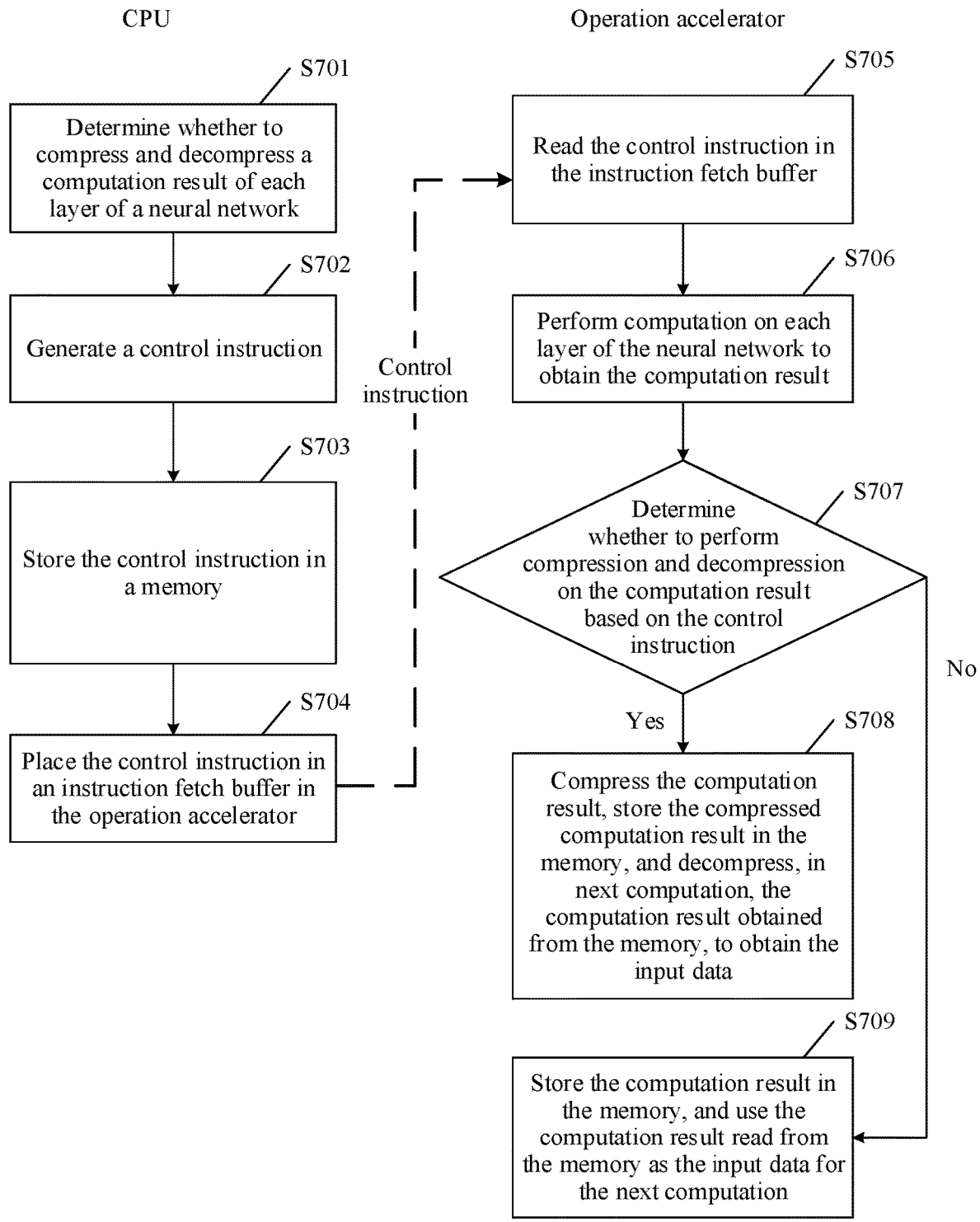
FIG. 7 is a flowchart of a method for controlling an operation accelerator to perform compression according to an embodiment of this application.

With reference to the diagram of the hardware structure of the operation accelerator in the foregoing embodiment, an embodiment of this application provides a method for controlling the operation accelerator to perform compression. As shown in FIG. 7, the method may include the following steps S701 to S709. S701 to S704 are performed by a host CPU, and S705 to S709 are performed by the operation accelerator.

S701: Determine whether to compress and decompress a computation result of each layer of a neural network.

The CPU analyzes a feature of the neural network formed after training (the neural network formed after training is a neural network on which the operation accelerator performs an inference operation), for example, through algorithm analysis or measured data. Then, the CPU deduces a sparse rate of input data at each layer in a neural network process based on the feature of the neural network obtained through analysis, determines whether to compress and decompress the computation result of each layer based on the sparse rate of the input data at each layer. Specifically, this may be implemented by comparing the sparse rate of the input data at each layer with a threshold. A specific implementation method is described in detail in the foregoing embodiment. Details are not described herein again.

S702: Generate a control instruction.

A compilation module inside the CPU performs instruction decoding based on information about whether the computation result of each layer is compressed and decompressed, to generate the control instruction. The control instruction is used to instruct whether the operation accelerator compresses and decompresses the computation result of each layer of the neural network.

S703: Store the control instruction in a memory.

The CPU stores the generated control instruction in the memory outside the operation accelerator.

S704: Place the control instruction in an instruction fetch buffer in the operation accelerator.

The CPU controls transfer of the control instruction stored in the memory to the instruction fetch buffer in the operation accelerator.

S705: Read the control instruction in the instruction fetch buffer.

The operation accelerator reads the control instruction from the instruction fetch buffer.

S706: Perform computation on each layer of the neural network to obtain the computation result.

The operation accelerator performs the computation on the input data at each layer of the neural network and obtains the computation result. Specifically, an operation circuit in the operation accelerator may perform an operation.

S707: Determine whether to perform compression and decompression on the computation result based on the control instruction.

The operation accelerator parses the control instruction, and determines whether to perform the compression and the decompression on the computation result of each layer of the neural network based on the control instruction. When it is determined to perform the compression and the decompression, S708 is performed. When it is not determined to perform the compression and the decompression, S709 is performed.

S708: Compress the computation result, store the compressed computation result in the memory, and decompress, in next computation, the computation result obtained from the memory, to obtain the input data.

When determining that the computation result needs to be compressed, the operation accelerator compresses the computation result, and stores the compressed computation result in the memory. When performing computation on a next layer of the neural network, the operation accelerator obtains the computation result from the memory, and performs the decompression on the obtained computation result to obtain decompressed data. The decompressed data is used as input data for computation on the next layer of the neural network.

S709: Store the computation result in the memory, and use the computation result read from the memory as the input data for the next computation.

When determining that the computation result does not need to be compressed, the operation accelerator directly stores the computation result in the memory. When performing the computation on the next layer of the neural network, the operation accelerator obtains the computation result from the memory, and uses the obtained computation result as input data for the computation on the next layer of the neural network. In this case, the computation result obtained by the operation accelerator does not need to be decompressed.

It can be learned from the foregoing that, for input data with a relatively low sparse rate in the neural network, if the operation accelerator starts the compression and the decompression, a compression gain is low. In this embodiment of this application, the CPU controls the operation accelerator to compress and decompress a computation result of a specific layer only when determining that a sparse rate of input data at the layer of the neural network is relatively large. In this case, because an I/O bandwidth gain is relatively large, the compression gain is improved.

All or some of the foregoing embodiments may be implemented by means of software, hardware, firmware, or any combination thereof. When software is used to implement the embodiments, all or some of the foregoing embodiments may be implemented in a form of a computer program product. The computer program product includes one or more computer instructions. When the foregoing computer program instructions are loaded or executed on an operation accelerator, all or some of the foregoing procedures or functions according to the embodiments of this application are generated. The computer storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), or a semiconductor medium. The semiconductor medium may be a solid-state drive (SSD).

The foregoing descriptions are merely specific implementations of this application, but are not intended to limit the protection scope of this application. Any modification or replacement readily figured out by a person skilled in the art within the technical scope disclosed in this application shall fall within the protection scope of this application. Therefore, the protection scope of this application shall be subject to the protection scope of the claims.

What is claimed is:

1. An operation accelerator, comprising:
   a first buffer, configured to store first input data;
   a second buffer, configured to store weight data;
   an operation circuit connected to the first buffer and the second buffer, configured to perform matrix multiplication on the first input data and the weight data, to obtain a computation result;
   a compression module, configured to compress the computation result to obtain compressed data;
   a third buffer, configured to store a control instruction, wherein the control instruction instructs whether to compress the computation result;
   a controller connected to the third buffer and configured to obtain the control instruction from the third buffer, and when the control instruction comprises instructions to compress the computation result, control the compression module to compress the computation result to obtain the compressed data; and
   a direct memory access controller (DMAC) connected to the compression module, configured to store the compressed data in a memory outside the operation accelerator.

2. The operation accelerator according to claim 1, further comprising:
a decompression module connected to the DMAC and the first buffer, configured to receive the compressed data obtained by the DMAC from the memory, decompress the compressed data, and store the decompressed data in the first buffer as second input data, wherein the operation circuit is further configured to obtain the second input data from the first buffer to perform matrix multiplication.

3. The operation accelerator according to claim 2, wherein the control instruction is used to instruct whether to decompress the computation result; and
the controller is configured to parse the control instruction, and when the control instruction comprises instructions to decompress the computation result:
control the decompression module to decompress the obtained compressed data.

4. The operation accelerator according to claim 3, further comprising:
a fourth buffer connected to the operation circuit, configured to store the computation result of the operation circuit; and
the controller is further configured to: when the control instruction skips instructing to compress or decompress the computation result,
control the DMAC to store the computation result in the fourth buffer into the memory, and
control the DMAC to store the computation result in the memory into the first buffer.

5. The operation accelerator according to claim 2, wherein the control instruction is used to instruct whether to decompress the computation result;
the controller is configured to distribute the control instruction to the compression module and the decompression module;
the compression module is configured to parse the control instruction, and when the control instruction comprises instructions to compress the computation result, compress the computation result to obtain the compressed data; and
the decompression module is configured to parse the control instruction, and when the control instruction comprises instructions to decompress the computation result, decompress the obtained compressed data.

6. The operation accelerator according to claim 5, wherein
the compression module is further configured to: when the control instruction skips instructing to compress the computation result, control the DMAC to store the computation result in the memory; and
the decompression module is further configured to: when the control instruction skips instructing to decompress the computation result, control the DMAC to store the computation result in the memory into the first buffer.

7. The operation accelerator according to claim 2, wherein the compression module comprises a fragmentation module and at least one compression engine, wherein
the fragmentation module is configured to perform fragmentation processing on the computation result to obtain at least one sub-computation result; and
each compression engine in the at least one compression engine is configured to compress a respective sub-computation result in the at least one sub-computation result to obtain respective sub-compressed data, wherein a sum of all the respective sub-compressed data generated by each compression engine in the at least one compression engine forms the compressed data.

8. The operation accelerator according to claim 7, wherein each compression engine in the at least one compression engine is configured to:
compress the respective sub-computation result to obtain a respective sub-compression result;
compare size of the respective sub-compression result with size of the respective sub-computation result;
when the size of the respective sub-compression result is greater than the size of the respective sub-computation result, use the respective sub-computation result as the respective sub-compressed data; or
when the size of the respective sub-compression result is not greater than the size of the respective sub-computation result, use the respective sub-compression result as the respective sub-compressed data.

9. The operation accelerator according to claim 8, wherein each compression engine in the at least one compression engine is further configured to:
when the size of the respective sub-compression result is greater than the size of the respective sub-computation result, generate a respective compression failure identifier corresponding to the respective sub-compressed data and store the respective compression failure identifier in the memory; and
when the size of the respective sub-compression result is not greater than the size of the respective sub-computation result, generate a respective compression success identifier corresponding to the respective sub-compressed data and store the respective compression success identifier in the memory.

10. The operation accelerator according to claim 9, wherein the decompression module is configured to:
receive the respective sub-compressed data from the memory;
when an identifier corresponding to the respective sub-compressed data is the respective compression failure identifier, store the respective sub-compressed data into the first buffer as the second input data; or
when the identifier corresponding to the respective sub-compressed data is the respective compression success identifier, decompress, as respective sub-decompressed data, the respective sub-compressed data, and store the respective sub-decompressed data into the first buffer as the second input data.

11. A compression method, wherein the compression method is applied to an operation accelerator, the operation accelerator comprises a first buffer and a second buffer, and the method comprises:
obtaining a computation result by performing matrix multiplication on first input data obtained from the first buffer and weight data obtained from the second buffer;
obtaining a control instruction, wherein the control instruction instructs whether to compress the computation result;
when the control instruction comprises instructions to compress the computation result, obtaining compressed data by compressing the computation result; and
storing the compressed data in a memory outside the operation accelerator.

12. The method according to claim 11, further comprising:
obtaining the compressed data from the memory;
decompressing the compressed data and storing the decompressed data into the first buffer as second input data; and
performing matrix multiplication on the second input data obtained from the first buffer.

13. The compression method according to claim 12, wherein
the control instruction is used to instruct whether to decompress the computation result, and the method further comprises:
parsing the control instruction;
wherein the decompressing the compressed data comprises:
when the control instruction comprises instructions to decompress the computation result, decompressing the compressed data.

14. The compression method according to claim 13, wherein the method further comprises:
when the control instruction skips instructing to compress or decompress the computation result, storing the computation result in the memory and storing the computation result in the memory into the first buffer.

15. A compression method, wherein the compression method is applied to an operation accelerator, the operation accelerator comprises a first buffer and a second buffer, and the method comprises:
obtaining a computation result by performing matrix multiplication on first input data obtained from the first buffer and weight data obtained from the second buffer;
obtaining a control instruction, wherein the control instruction is used to instruct whether to compress and decompress the computation result;
when the control instruction comprises instructions to compress the computation result, obtaining compressed data by compressing the computation result and storing the compressed data in a memory outside the operation accelerator; and
when the control instruction skips instructing to compress the computation result, storing the computation result in the memory outside the operation accelerator.

16. The method according to claim 15, wherein the method further comprises:
when the control instruction comprises instructions to decompress the computation result, decompressing the compressed data obtained from the memory, and performing matrix multiplication using the decompressed data as second input data; and
when the control instruction skips instructing to decompress the computation result, performing matrix multiplication using the computation result obtained from the memory as the second input data.

17. An operation accelerator, comprising:
one or more processors; and
a non-transitory computer readable medium storing a program to be executed by the one or more processors, wherein the program comprises instructions that cause the one or more processors to perform operations comprising:
storing, in a first buffer, first input data;
storing, in a second buffer, weight data;
obtaining a computation result by performing matrix multiplication on the first input data and the weight data;
storing, in a third buffer, a control instruction, wherein the control instruction instructs whether to compress the computation result;
obtaining the control instruction from the third buffer;
when the control instruction comprises instructions to compress the computation result, obtaining compressed data by compressing the computation result; and
storing the compressed data in a memory outside the operation accelerator.

18. The operation accelerator according to claim 17, wherein the operations further comprise:
receiving the compressed data from the memory;
decompressing the compressed data;
storing the decompressed data in the first buffer as second input data; and
obtaining the second input data from the first buffer to perform matrix multiplication.

19. The operation accelerator according to claim 18, wherein
the control instruction is used to instruct whether to decompress the computation result; and the operations further comprises:
parsing the control instruction; and
when the control instruction comprises instructions to decompress the computation result:
decompressing the compressed data.

20. The operation accelerator according to claim 19, wherein the operations further comprise:
storing, in a fourth buffer, the computation result; and
when the control instruction skips instructing to compress or decompress the computation result:
storing the computation result in the fourth buffer into the memory; and
storing the computation result in the memory into the first buffer.

* * * * *

UNITED STATES PATENT AND TRADEMARK OFFICE
CERTIFICATE OF CORRECTION

| | | |
|---|---|---|
| PATENT NO. | : 11,960,421 B2 | Page 1 of 1 |
| APPLICATION NO. | : 17/216476 | |
| DATED | : April 16, 2024 | |
| INVENTOR(S) | : Baoqing Liu, Hu Liu and Qinglong Chen | |

It is certified that error appears in the above-identified patent and that said Letters Patent is hereby corrected as shown below:

In the Claims

Column 21, Line 14, Claim 13, after "instruction;" insert therefore -- and --.

Signed and Sealed this
Third Day of September, 2024

Katherine Kelly Vidal
*Director of the United States Patent and Trademark Office*